(12) United States Patent
Imada et al.

(10) Patent No.: US 7,538,042 B2
(45) Date of Patent: May 26, 2009

(54) METHOD OF MANUFACTURING A STRUCTURE HAVING A PROJECTION

(75) Inventors: Aya Imada, Kanagawa (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 338 days.

(21) Appl. No.: 11/068,765

(22) Filed: Mar. 2, 2005

(65) Prior Publication Data

US 2005/0167852 A1   Aug. 4, 2005

Related U.S. Application Data

(62) Division of application No. 10/396,397, filed on Mar. 26, 2003, now Pat. No. 6,878,634.

(30) Foreign Application Priority Data

Apr. 10, 2002   (JP)   ............................. 2002-107580

(51) Int. Cl.
 *H01L 21/44*   (2006.01)
(52) U.S. Cl. ................ 438/746; 438/700; 257/E49.001
(58) Field of Classification Search ................. 438/700, 438/746
 See application file for complete search history.

(56) References Cited

U.S. PATENT DOCUMENTS

| | | | |
|---|---|---|---|
| 4,086,694 A | 5/1978 | U ................................ | 438/361 |
| 4,923,301 A | 5/1990 | White ......................... | 356/356 |
| 5,618,448 A | 4/1997 | Kuroe et al. .................. | 216/97 |
| 5,725,788 A | 3/1998 | Maracas et al. | |
| 5,785,338 A | 7/1998 | Chang ........................ | 280/278 |
| 5,882,823 A | 3/1999 | Neary ........................... | 430/5 |
| 6,139,713 A | 10/2000 | Masuda et al. .............. | 205/206 |
| 6,214,738 B1 | 4/2001 | Aiba et al. ................... | 438/707 |
| 6,278,231 B1 | 8/2001 | Iwasaki et al. ............... | 313/310 |
| 6,313,969 B1 | 11/2001 | Hattori et al. ................ | 360/135 |
| 6,464,853 B1 | 10/2002 | Iwasaki et al. ............... | 205/118 |
| 6,476,409 B2 | 11/2002 | Iwasaki et al. ................. | 257/13 |
| 6,521,285 B1 * | 2/2003 | Biebuyck et al. .............. | 216/13 |
| 6,602,620 B1 | 8/2003 | Kikitsu et al. ............ | 428/694 T |
| 6,610,463 B1 | 8/2003 | Ohkura et al. ............... | 430/322 |
| 2001/0028872 A1 | 10/2001 | Iwasaki et al. ........... | 423/447.3 |
| 2002/0012858 A1 | 1/2002 | Kawakubo et al. ............ | 430/22 |

(Continued)

FOREIGN PATENT DOCUMENTS

EP   0 931 859 A1   7/1999

(Continued)

OTHER PUBLICATIONS

Masuda et al, Fabrication of Gold Nanodot Array Using Anodic Porous Alumina as an Evaporation Mask, Jp. J. of Appl. Phys. vol. 35, 1996, pp. L126-129, Jan. 1996.*

(Continued)

*Primary Examiner*—Alexander G Ghyka
(74) *Attorney, Agent, or Firm*—Fitzpatrick, Cella, Harper & Scinto (57) ABSTRACT

A method of manufacturing a structure is provided. This method include a steps of preparing a first substrate having a projection, forming a first layer on the projection, transferring the first layer to a second substrate, and removing at least apart of the second substrate.

4 Claims, 5 Drawing Sheets

U.S. PATENT DOCUMENTS

| | | | |
|---|---|---|---|
| 2002/0014621 A1 | 2/2002 | Den et al. | 257/3 |
| 2002/0034662 A1 | 3/2002 | Den | 428/692 |
| 2002/0086185 A1 | 7/2002 | Yasui et al. | 428/694 |
| 2003/0175472 A1 | 9/2003 | Den et al. | 428/66.6 |
| 2004/0001964 A1 | 1/2004 | Ohkura et al. | 428/596 |
| 2004/0048092 A1 | 3/2004 | Yasui et al. | 428/642 |

FOREIGN PATENT DOCUMENTS

| | | |
|---|---|---|
| EP | 0 951 047 A2 | 10/1999 |
| JP | 7-171984 | 7/1995 |
| JP | 10-121292 | 5/1998 |
| JP | 11-200090 | 7/1999 |
| JP | 2000-195036 | 7/2000 |
| JP | 2001-277200 A | 10/2001 |
| WO | 00/79023 A1 | 12/2000 |

OTHER PUBLICATIONS

Definition of the word "deposit" from American Heritage Dictionary of the English language, 2000.*

Hutley, M.C. "Coherent Photofabrication", Opt. Eng., vol. 15, No. 3 (1976), pp. 190-196.

Decker, et al. "Generating . . . Reversal," J. Vac. Sci. Technol. B15(6), Nov. 1997 pp. 1949-1953.

Furneaux, et al. "The formation . . . aluminum", Nature, vol. 337, p. 147-149 (1989).

Hideki Masuda, "Highly-Ordered Nanohole-Array from Anodic Porous Alumina," 31(5) *Solid State Phys*. 493-499 (1996).

Hideki Masuda et al., "Fabrication of Gold Nanodot Array Using Anodic Porous Alumina as an Evaporation Mask," 35 *Jpn. J. Appl. Phys*. L126-L129 (1996).

O. Jessensky et al., "Self-Organized Formation of Hexagonal Pore Arrays in Anodic Alumina," 72(10) *Appl. Phys. Lett*. 1173-1175 (Mar. 1998).

* cited by examiner

METHOD OF MANUFACTURING A STRUCTURE HAVING A PROJECTION

This application is a division of application Ser. No. 10/396,397, filed Mar. 26, 2003, which is incorporated herein by reference.

BACKGROUND OF THE INVENTION

1. Field of the Invention

The present invention relates to a structure having recesses and projections, a method of manufacturing the structure, and a functional device utilizing the structure. Also, the present invention relates to a method of manufacturing a nano-structure having a nano-scale pitch.

2. Description of the Related Art

Hitherto, manufacturing a porous structure with the anodic oxidation process has received attention as a simple method for forming a structure having recesses and projections of from nanometer to micrometer sizes. The anodic oxidation process generally comprises the steps of immersing a workpiece in an acidic solution, and applying a voltage with the workpiece serving as an anode to cause phenomena of dissolution and oxidation of the workpiece surface at the same time, thereby forming a microscopic recessed/projected structure. This microscopic structure is known as exhibiting regularity through self-assembly under certain conditions (such as voltage, temperature and kind of acid), and applications of the microscopic structure to various nano-devices, such as a recording medium and an optical functional device, are expected.

One practical example of the anodic oxidation process is anodic oxidation of aluminum. When a voltage is applied to a bath of an aqueous solution of oxalic acid, phosphoric acid, or sulfuric acid with aluminum serving as an anode, nanoholes having wall surfaces given by a barrier layer (alumina) are formed at a nanometer-size pitch and a porous coating is obtained. While a similar phenomenon may also occur with another kind of metal, it is generally known that columnar pores (nanoholes) with the best straightness can be obtained using aluminum. The anodic oxidation of aluminum can form pores in a regular array in which the pore pitch is several tens nanometers ("Appl. Phys. Lett.", 72, 1173, 1998), or in an irregular array in which the average pore pitch is about 18 nm and the pore diameter is 8 nm (Japanese Patent Laid-Open No. 2000-195036). The pores in a regular array are obtained by carrying out the anodic oxidation while holding the conditions, such as the kind of acid, concentration, temperature and the applied voltage, at certain values, but a long time is required until the pores are formed in a regular array through self-assembly alone.

Figure 5A:
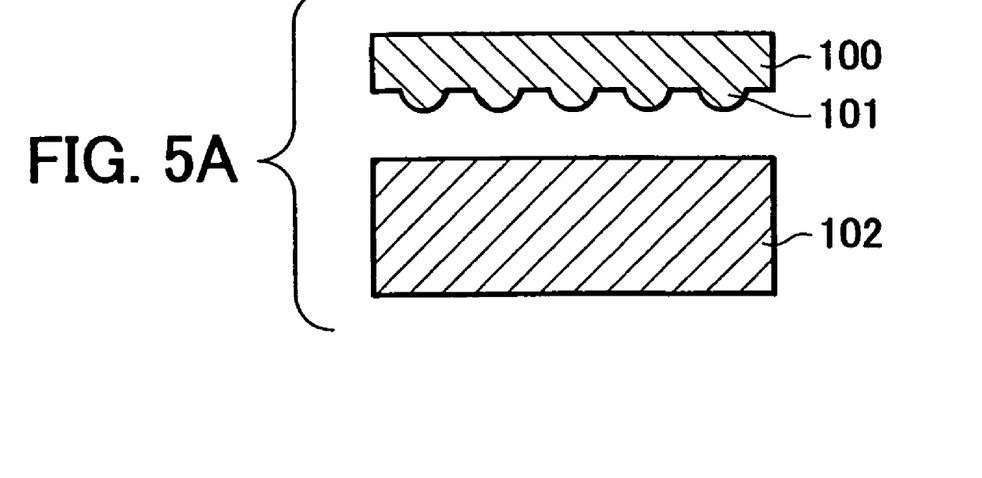
FIGS. 5A to 5C are explanatory views showing a conventional method of forming start points for pore formation in a substrate to be subjected to anodic oxidation.
Figure 5B:
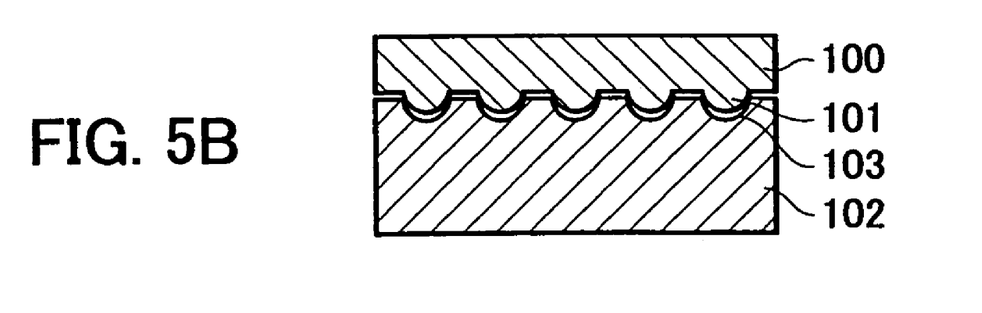
Figure 5C:
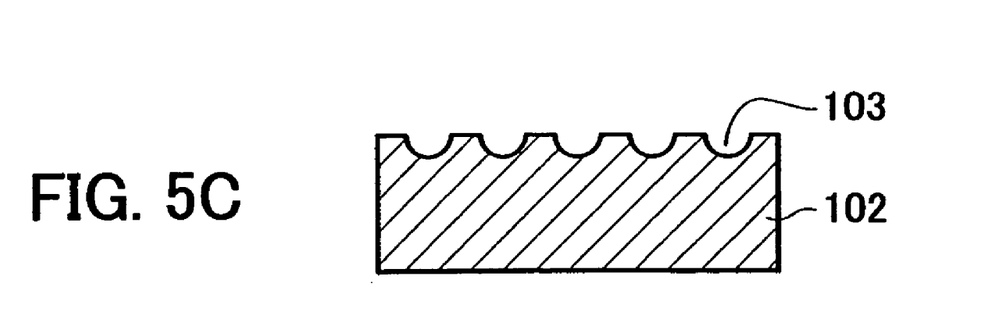

To improve the above-mentioned problem, there has been so far proposed a method of forming regularly arrayed recesses in the surface of a workpiece in advance by any suitable method, and carrying out anodic oxidation with the recesses serving as start points for pore formation by the anodic oxidation. This method can produce vertical pores in a very short time, which are arranged in a regular array and are directly extended from the workpiece surface. As shown in FIGS. 5A to 5C, Japanese Patent-Laid Open No. 10-121292 proposes a method comprising the steps of fabricating a stamper 100 having regularly arrayed projections 101 by, e.g., photolithography or electron beam drawing (see FIG. 5A), and forming recesses 103 by pressing, which serve as start points for pore formation, in a transfer member 102, i.e., a substrate which is subjected to the anodic oxidation (FIGS. 5B and 5C).

SUMMARY OF THE INVENTION

With the method disclosed in the above-cited Japanese Patent-Laid Open No. 10-121292, however, since direct pressing is employed to form the recesses in the metal-made workpiece subjected to the anodic oxidation, a very high pressure is required to form the recesses over a large area, and the workpiece tends to easily break because of a high load imposed on the substrate. Thus, there is a demand for a stamper having strength enough to be endurable against repeated use.

With the view of overcoming the problems set forth above, it is an object of the present invention to provide a structure having recesses and projections, a method of manufacturing the structure, and a functional device utilizing the structure.

A method of manufacturing a structure, according to the present invention, comprises the steps of preparing a first substrate having a projection; forming a first layer on the projection; transferring the first layer to a second substrate; and forming a recessed/projected surface structure in the second substrate by using the first layer.

The step of forming a recessed/projected surface structure is, for example, a step of forming the recessed/projected surface structure in the second substrate by using the first layer as a mask.

The second substrate may have a second layer on a surface thereof, and the recessed/projected surface structure may be formed in the second layer.

The first layer may be removed after formation of the recessed/projected surface structure.

A third layer may be provided between the first substrate and the first layer.

In the following description of embodiments, the first substrate is expressed as a recessed/projected substrate, the first layer is expressed as a transfer thin-film layer, and a second substrate is expressed as a transfer substrate.

When the second layer is provided on the second substrate, predetermined areas of the second layer can be selectively subjected to exposure, etc. by utilizing the first layer on the second layer as a mask. In this case, the second layer is employed as a mask for forming a recessed/projected surface structure in the second substrate.

Also, a method of manufacturing a structure, according to the present invention, comprises the steps of preparing a first substrate having a projection; forming a first layer at least on the projection of the first substrate; pressing the first layer against a second substrate and transferring the first layer to at least the second substrate; forming a recessed/projected surface structure in the second substrate by using the first layer as a mask; and carrying out anodic oxidation of the second substrate to form pores therein with recesses of the recessed/projected surface structure serving as start points for formation of the pores.

Stated otherwise, according to a first aspect of the present invention, a method of manufacturing a nano-structure comprises a step (1) of forming a recessed/projected surface structure in a substrate to prepare a recessed/projected substrate, a step (2) of forming a transfer thin-film layer at least on projections of the recessed/projected substrate, a step (3) of pressing the transfer thin-film layer against a transfer substrate, peeling off the transfer thin-film layer formed at least on the projections and transferring the transfer thin-film layer to the transfer substrate, and a step (4) of etching the transfer substrate with the transfer thin-film layer serving as a mask, thereby forming a recessed/projected surface structure in a surface of the transfer substrate.

According to a second aspect of the present invention, a method of manufacturing a nano-structure comprises a step (1) of forming a recessed/projected surface structure in a substrate to prepare a recessed/projected substrate, a step (2) of forming a transfer thin-film layer at least on projections of the recessed/projected substrate, a step (3) of pressing the transfer thin-film layer against a transfer substrate, peeling off the transfer thin-film layer and transferring the transfer thin-film layer formed at least on the projections to the transfer substrate, a step (4) of forming a recessed/projected surface structure in a surface of the transfer substrate by etching of the transfer substrate while using the transfer thin-film layer as a mask, and a step (5) of removing the transfer thin-film layer from the surface of the transfer substrate.

According to a third aspect of the present invention, a method of manufacturing a nano-structure comprises a step (1) of forming a recessed/projected surface structure in a substrate to prepare a recessed/projected substrate, a step (2) of forming a transfer thin-film layer at least on projections of the recessed/projected substrate, a step (3) of pressing the transfer thin-film layer against a transfer substrate, peeling off the transfer thin-film layer formed at least on the projections and transferring the transfer thin-film layer to the transfer substrate, a step (4a) of etching the transfer substrate with the transfer thin-film layer serving as a mask, thereby forming a recessed surface structure in a surface of the transfer substrate, and a step (4b) of forming pores by anodic oxidation carried out with the recessed surface structure serving as a start pattern for formation of the pores.

According to a fourth aspect of the present invention, a method of manufacturing a nano-structure comprises a step (1) of forming a recessed/projected surface structure in a substrate to prepare a recessed/projected substrate, a step (2) of forming a transfer thin-film layer at least on projections of the recessed/projected substrate, a step (3) of pressing the transfer thin-film layer against a transfer substrate, peeling off the transfer thin-film layer formed at least on the projections and transferring the transfer thin-film layer to the transfer substrate, a step (4a) of etching the transfer substrate with the transfer thin-film layer serving as a mask, thereby forming a recessed surface structure in a surface of the transfer substrate, a step (5) of removing the transfer thin-film layer from the surface of the transfer substrate, and a step (4b) of forming pores by anodic oxidation carried out with the recessed surface structure serving as a start pattern for formation of the pores.

Preferably, the recessed/projected substrate has the recessed/projected surface structure at least in a part thereof, and a release layer is provided on a surface of the recessed/projected surface structure.

Preferably, the transfer substrate has a flat surface at least in a part thereof, and an adhesive layer or a sticky layer is provided on the flat surface.

In the step (1), preferably, the recessed/projected surface structure is formed by lithography using at least one selected from among an electron beam, ion beam, X-ray, EUV (extreme ultraviolet ray), ultraviolet ray and visible light, or by wet or dry etching.

In the step (1), preferably, the recessed/projected surface structure is formed by using a substrate of which surface is made of metals containing aluminum as a main component, and carrying out anodic oxidation with the substrate immersed in a solution.

In the step (1), preferably, the recessed/projected surface structure is formed by electron beam direct drawing. The etching in the step (4) is preferably wet or dry etching.

The etching in the step (4) is preferably etching carried out by anodic oxidation of the transfer substrate.

Preferably, the transfer substrate is made of metals containing aluminum as a main component. Preferably, the transfer substrate comprises an undercoat layer containing, as a main component, at least one element other than aluminum, and a surface layer containing aluminum as a main component.

Preferably, the transfer thin-film layer is made of a metal, a semiconductor or a resin.

The present invention further provides the nano-structure manufactured by any of the above-described methods of manufacturing the nano-structure, and a functional device obtained by filling a functional material in recesses or pores of the recessed/projected surface structure formed by the manufacturing method.

Further objects, features and advantages of the present invention will become apparent from the following description of the preferred embodiments with reference to the attached drawings.

DESCRIPTION OF THE PREFERRED EMBODIMENTS

A method of manufacturing a structure having recesses and projections, according to the present invention, comprises the steps described below with reference to FIGS. 1A to 1D.

Figure 1A:
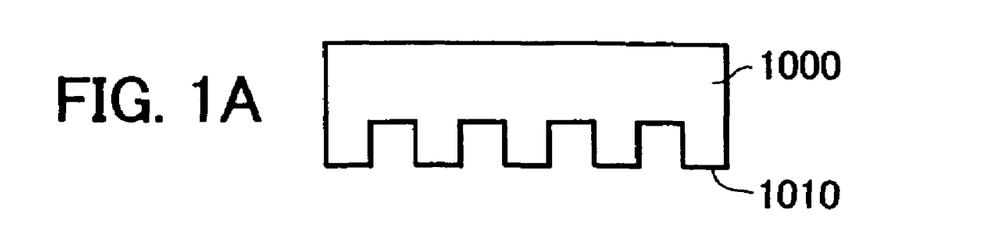
FIGS. 1A to 1D are schematic views showing steps of a method of manufacturing a structure having recesses and projections according to the present invention.
Figure 1B:
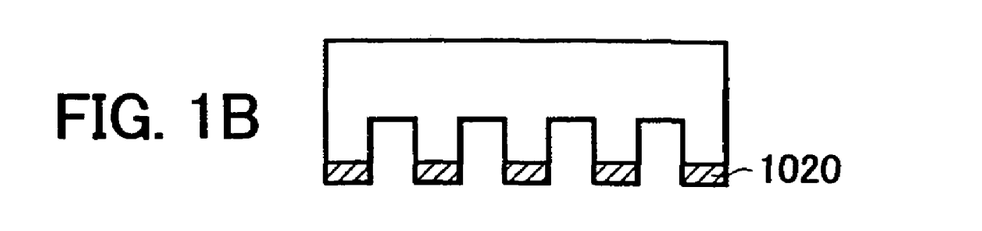
Figure 1C:
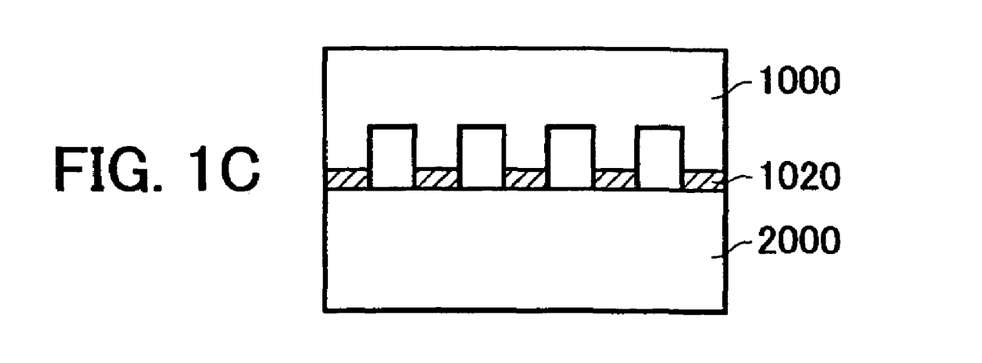
Figure 1D:
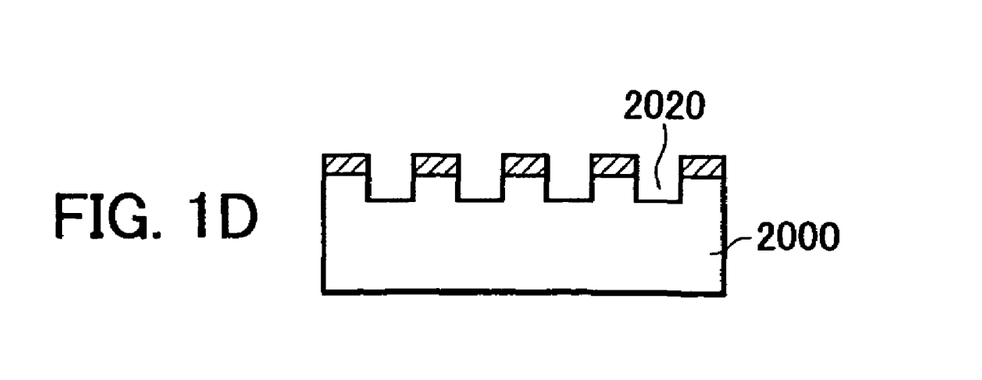

The structure according to the present invention is manufactured by the steps of preparing a first substrate 1000 having projections 1010 (FIG. 1A), forming a first layer 1020 on the projections 1010 (FIG. 1B), transferring the first layer 1020 to a second substrate 2000 (FIG. 1C), and forming a recessed/projected surface structure 2020 in the second substrate by employing the first layer 1020 (FIG. 1D).

While the first layer 1020 is formed only on the projections 1010 in FIG. 1B, it may be formed in recesses as well. Also, while the first substrate 1000 is not shown in FIG. 1D as being moved away from the first layer 1020, the first substrate may be not moved away from the first layer.

Various functional devices (such as a recording medium) can be obtained by filling a functional material, such as a semiconductor material, a metallic material, a resin material or a magnetic material, in the recesses (which may be pores in some cases) of the structure having the recesses and projections, which has been manufactured by the above-described method.

The present invention will be described below in more detail.

A method of manufacturing a nano-structure according to a first aspect of the present invention comprises a step (1) of forming a recessed/projected surface structure in a substrate to prepare a recessed/projected substrate, a step (2) of forming a transfer thin-film layer at least on projections of the recessed/projected substrate, a step (3) of pressing the transfer thin-film layer against a transfer substrate, peeling off the transfer thin-film layer formed at least on the projections and transferring the transfer thin-film layer to the transfer substrate, and a step (4) of wet or dry etching exposed areas of the transfer substrate with the transfer thin-film layer serving as a mask, thereby forming a recessed/projected surface structure in a surface of the transfer substrate. By employing the recesses of the recessed/projected surface structure as start points for formation of pores (nanoholes) by anodic oxidation, a pore structure having the pores arrayed in desired positions on the surface of the transfer substrate can be easily manufactured in a short time.

Also, a feature of the present invention resides in forming solid thin films on the projections of the recessed/projected substrate and transferring the thin films to the surface of the transfer substrate.

The method of manufacturing the nano-structure according to the present invention will now be described with reference to the drawing.

Figure 2A:
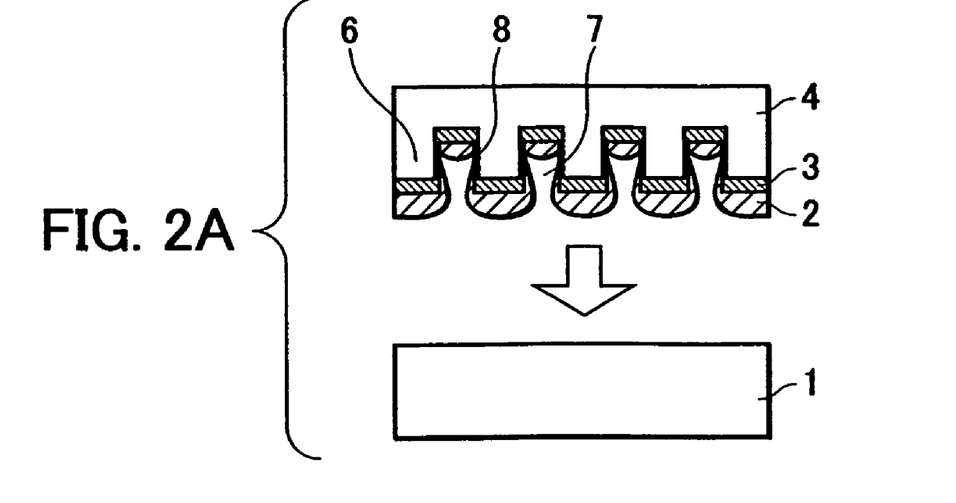
FIGS. 2A to 2C are schematic views showing steps of an embodiment (one example) of a method of manufacturing a nano-structure of the present invention.
Figure 2B:
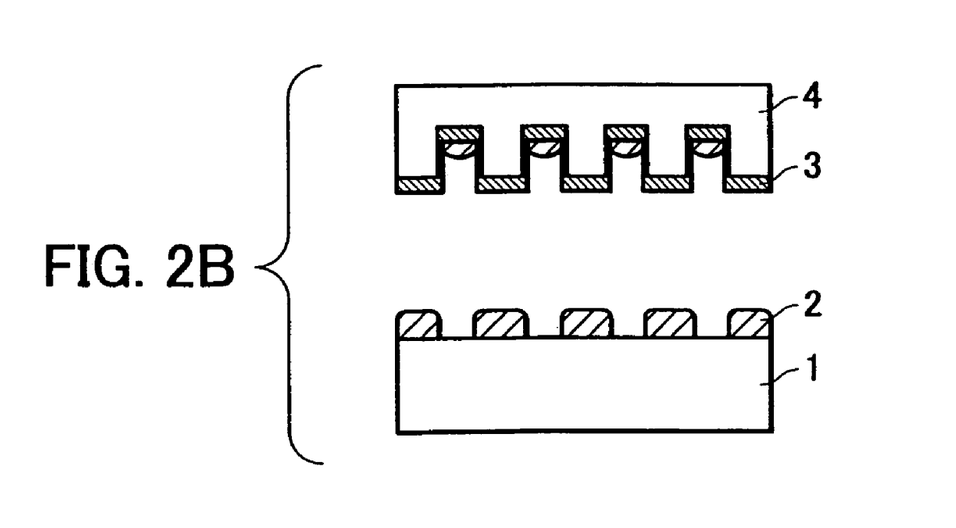
Figure 2C:
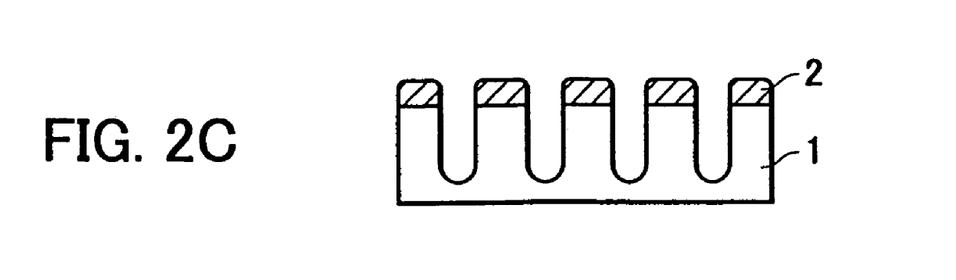

FIGS. 2A to 2C are schematic views showing steps of an embodiment of the method of manufacturing the nano-structure according to the present invention.

Step (1): Preparation of Recessed/Projected Substrate

With the method of manufacturing the nano-structure according to the present invention, as shown in FIGS. 2A to 2C, a recessed/projected substrate 4 is prepared by forming at least one recess 7 and projection 6 on a substrate with, e.g., lithography using an electron beam, ion beam, X-ray, EUV (extreme ultraviolet ray), ultraviolet ray or visible light, wet or dry etching, electron beam direct drawing, or anodic oxidation (FIG. 2A). The surface of the projection 6 is preferably flat. When a plurality of projections are formed, the surfaces of the projections are preferably positioned to lie in the same plane.

Step (2): Formation of Transfer Thin-Film Layer

A release layer 3 is formed on the recessed/projected substrate 4 by spin coating, for example, in thickness as thin as to such an extent that the recessed/projected surface structure of the recessed/projected substrate 4 is not lost. The release layer 3 is made of silicone oil or fluorocarbon resin, for example, and it preferably has poor adhesion with the recessed/projected substrate or a transfer thin-film layer.

Then, a transfer material, such as aluminum, is formed on the release layer 3 by sputtering or vapor deposition to form a transfer thin-film layer 2. When the recessed/projected substrate 4 has the recesses 7 arrayed at a pitch of about several tens nm to several hundreds nm, the transfer material can be coated while entering up to the bottom of each recess 7 by sputtering the transfer material in a direction vertical to the substrate 4, and the recessed/-projected surface structure can be maintained with higher reliability than the case of sputtering the transfer material at an oblique incidence angle. By setting proper conditions in consideration of the above, the transfer material can be formed such that an intermediate portion 8 of the transfer thin-film layer 2 between the transfer material coated on an upper surface of the projection and the transfer material coated on a bottom surface of the recess is very thin (see FIG. 2A).

Step (3): Transfer of Transfer Thin-Film Layer

As shown in FIG. 2A, the formed transfer thin-film layer 2 is pressed against a transfer substrate 1. For example, when the adhesion between the transfer substrate 1 and the transfer thin-film layer 2 is greater than the force required for peeling off the transfer thin-film layer 2 from the recessed/projected substrate 4, the transfer thin-film layer 2 coated on the projections of the recessed/projected substrate 4 is attached onto the transfer substrate 1 and is torn in portions where the strength is relatively weak, i.e., at boundaries between the recesses and the projections. Thus, the transfer thin-film layer 2 is transferred to the transfer substrate 1 as shown in FIG. 2B. In this step, a sticky layer of an adhesive, for example, may be coated on the transfer substrate 1 beforehand.

Step (4): Etching

With the transfer thin-film layer 2 serving as a mask, exposed areas of the transfer substrate 1 are subjected to wet or dry etching to form, in the transfer substrate 1, a recessed/projected surface structure reflecting the mask pattern (see FIG. 2C). For example, when the transfer thin-film layer 2 is endurable against an acidic solution used for the anodic oxidation and the transfer substrate 1 is a thin film containing aluminum as a main component, a formed nano-structure can be used as a start pattern for forming nanoholes by the anodic oxidation, and nanoholes reflecting the mask pattern can be formed by immersing the transfer substrate 1 in an acidic bath and applying a voltage with the transfer substrate 1 serving as an anode.

When the transfer thin-film layer 2 is not endurable against the acidic solution, it is possible to form recesses in the transfer substrate 1 by usual etching, such as dry or wet etching, and then to carry out the anodic oxidation with the recesses serving as start points for pore formation by the anodic oxidation. Alternatively, the transfer substrate 1 having subjected to the dry or wet etching may be directly used itself as a nano-structure without carrying out the anodic oxidation.

A method of manufacturing a nano-structure according to a second aspect of the present invention comprises a step (1) of forming a recessed/projected surface structure in a substrate to prepare a recessed/projected substrate, a step (2) of forming a transfer thin-film layer at least on projections of the recessed/projected substrate, a step (3) of pressing a surface of the transfer thin-film layer against a surface of a transfer substrate, peeling off the transfer thin-film layer and transferring the transfer thin-film layer formed at least on the projections from the recessed/projected substrate to the transfer substrate, a step (4) of forming a recessed/projected surface structure in a surface of the transfer substrate by etching, and a step (5) of removing the transfer thin-film layer from the surface of the transfer substrate.

With the method of manufacturing the nano-structure according to the second aspect, the transfer thin-film layer is transferred to the transfer substrate and a structure reflecting the mask pattern is formed in the transfer substrate by etching as with the above-described method of manufacturing the nano-structure according to the first aspect. Thereafter, the transfer thin-film layer is removed from the transfer substrate using a solution that is able to dissolve the transfer thin-film layer, whereby only a nano-structure formed in the transfer substrate can be obtained. In particular, when the transfer thin-film layer is dissoluble in the acidic bath used for the anodic oxidation, the anodic oxidation is preferably carried out after removing the transfer thin-film layer because the acidic bath is contaminated.

EXAMPLES

Examples of the present invention will be described below in detail with reference to the drawings.

Example 1

This Example 1 represents one example of the method of manufacturing the nano-structure according to the first aspect of the present invention.

The first method of the present invention comprises, as shown in FIGS. 2A to 2C, a step (1) of forming a recessed/projected surface structure in a substrate to prepare a recessed/projected substrate 4, a step (2) of forming a transfer thin-film layer 2 at least on projections 6 of the recessed/projected substrate 4, a step (3) of pressing a surface of the transfer thin-film layer 2 against a surface of a transfer substrate 1, peeling off the transfer thin-film layer 2 and transferring the transfer thin-film layer 2 formed at least on the projections from the recessed/projected substrate 4 to the transfer substrate 1, and a step (4) of forming a recessed/projected surface structure in the surface of the transfer substrate 1.

More specifically, by way of example, the recessed/projected substrate 4 is prepared by forming columns of a 200-nm diameter and a 500-nm height, which are arrayed at a pitch of 100 nm, on a Si substrate with the electron beam exposure and the dry etching process (step (1)). Preferably, recesses 7 and the projections (columns) 6 of the recessed/projected substrate 4 have a larger level difference, and side walls of the columns are more nearly vertical to the Si substrate.

A perfluoro resin having a carboxyl group (COOH) as an end group (e.g., Cytop (trade name) manufactured by Asahi Glass Company Ltd., perfluorobutenylvinyl ether having an end group COOH) has stronger adhesion with a metal. This perfluoro resin is coated (in thickness of about 20 nm) by spin coating such that the recessed/projected surface structure of the Si substrate is not lost, thereby forming a release layer 3.

Then, the transfer thin-film layer 2 is formed by sputtering aluminum in thickness of about 30 nm in a direction vertical to the recessed/projected substrate 4. With the sputtering in the vertical direction, aluminum is hardly deposited on wall surfaces of the Si columns, and the connection strength between aluminum films coated on upper surfaces of the projections 6 and bottom surfaces of the recesses 7 is weak (step (2)).

Subsequently, as shown in FIG. 2B, the surface of the transfer thin-film layer 2 on the recessed/projected substrate 4 and the surface of the transfer substrate 1 made of an epoxy resin are positioned in a facing relation, pressed against each other under a pressure of 3 MPa, and then separated from each other. Because the transfer thin-film layer 2 of aluminum coated on the projections 6 of the Si recessed/projected substrate 4 has greater adhesion to the epoxy resin than to the perfluoro resin, the transfer thin-film layer 2 is transferred to the transfer substrate 1 (step (3)). The aluminum films coated on the bottom surfaces of the recesses 7 remains on the recessed/projected substrate 4 because they are not brought into contact with the epoxy resin and the connection strength to the aluminum film coated on the projections 6 is weak.

In the next step (4), the transfer substrate 1 is subjected to dry etching in oxygen gas with the transferred aluminum thin film serving as a shield mask. As a result, a nano-structure reflecting the mask pattern is obtained in the form of the transfer substrate 1 as shown in FIG. 2C.

Example 2

This Example 2 represents another example of the method of manufacturing the nano-structure according to the first aspect of the present invention.

Figure 3:
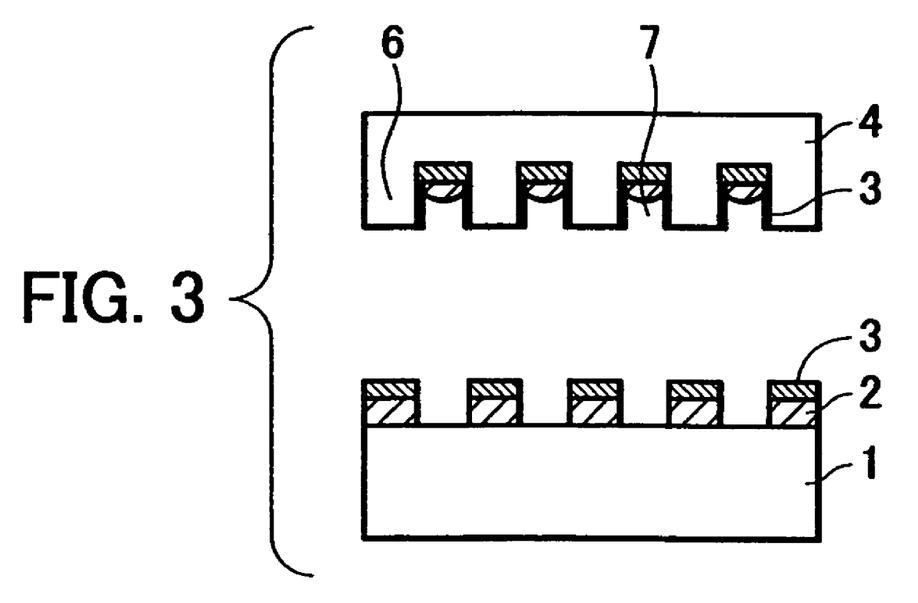
FIG. 3 is an explanatory view showing another example of the method of manufacturing the nano-structure of the present invention.

In this Example 2, as shown in FIG. 3, the release layer 3 and the transfer thin-film layer 2 both coated on the projections 6 are transferred to the transfer substrate 1 in the step (2) according to the first method of the present invention in above Example 1.

More specifically, the recessed/projected substrate 4 is prepared by forming columns of a 200-nm diameter and a 500-nm height, which are arrayed at a pitch of 100 nm, on a glass substrate with the electron beam exposure and the dry etching process (step (1)).

A perfluoro resin having $CF_3$ as an end group (e.g., Cytop (trade name) manufactured by Asahi Glass Company Ltd., perfluorobutenylvinyl ether having an end group $CF_3$) has much weaker adhesion with glass than with a metal. This perfluoro resin having the end group $CF_3$ is coated (in thickness of about 15 nm) by spin coating such that the recessed/projected surface structure of the glass substrate is not lost, thereby forming a release layer 3.

Then, the transfer thin-film layer 2 is formed by sputtering aluminum in thickness of about 30 nm in a direction vertical to the recessed/projected substrate 4. With the sputtering in the vertical direction, aluminum is hardly deposited on wall surfaces of the glass columns, and the connection strength between aluminum films coated on upper surfaces of the projections 6 and bottom surfaces of recesses 7 is weak (step (2)).

Subsequently, as shown in FIG. 3, the surface of the transfer thin-film layer 2 on the recessed/projected substrate 4 and the surface of the transfer substrate 1 made of an epoxy resin are positioned in a facing relation, pressed against each other under a pressure of 3 MPa, and then separated from each other. Because the adhesion between the release layer 3 of the perfluoro resin and the glass-made recessed/projected substrate 4 is relatively small and the adhesion between the release layer 3 of the perfluoro resin and the transfer thin-film layer 2 of aluminum is relatively great, the release layer 3 of the perfluoro resin and the transfer thin-film layer 2 of aluminum both coated on the projections 6 of the glass-made recessed/projected substrate 4 are transferred to the transfer substrate 1 in a multilayered state (step (3)).

The perfluoro resin exhibits very high resistance against chemicals. By carrying out chemical etching of the transfer substrate 1 in a solution of phosphoric acid with the transferred release layer 3 of the perfluoro resin serving as a mask, therefore, the transfer substrate 1 having a recessed/projected surface structure reflecting the mask pattern can be obtained (step (4)).

When the transfer substrate 1 is an aluminum substrate having an aluminum oxide layer on its surface, anodic oxidation alumina nanoholes in a regular array can be easily obtained by preparing the recessed/projected substrate having recesses and projections in a regular array in the step (1), forming a recessed/projected surface structure in the transfer substrate in a similar manner to that in the steps (2) to (4), and carrying out the anodic oxidation with the recessed/projected surface structure serving as a start pattern.

Example 3

This Example 3 represents still another example of the method of manufacturing the nano-structure according to the first aspect of the present invention.

Figure 4A:
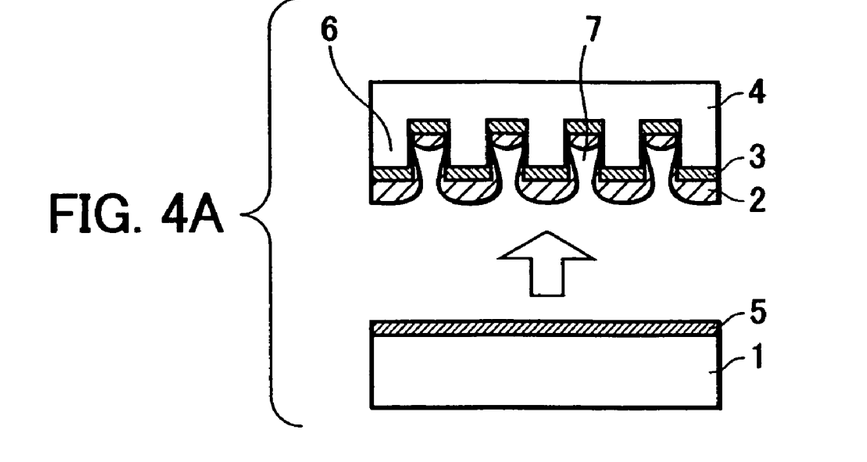
FIGS. 4A to 4C are schematic views showing steps of still another example of the method of manufacturing the nano-structure of the present invention.
Figure 4B:
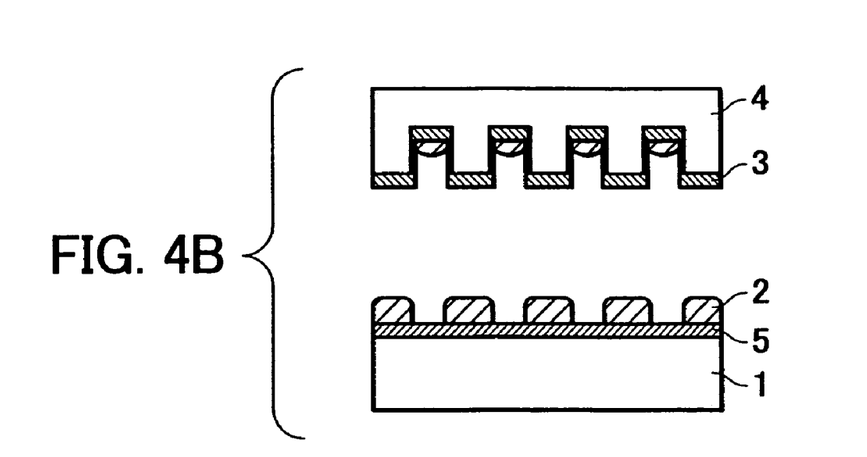
Figure 4C:
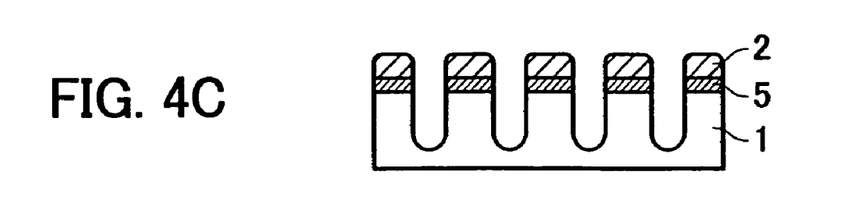

In this Example 3, as shown in FIGS. 4A to 4C, an adhesive layer is formed on the surface of the transfer substrate to promote peeling-off of the transfer thin-film layer in the first method according to the present invention when the nano-structure is formed in a substrate having weak adhesion to the transfer thin-film layer.

More specifically, in a step (1), nanoholes are formed in an aluminum substrate with anodic oxidation by immersing the aluminum substrate in a bath of oxalic acid at 16° C. to serve as an anode and applying 40 V to the bath. Then, the diameter of each of the nanoholes is enlarged to about 60 nm by holding the aluminum substrate in an aqueous solution of phosphoric acid at the room temperature for 50 minutes to dissolve aluminum oxide (alumina), whereby a recessed/projected substrate 4 is obtained. Incidentally, the adhesion between tungsten and nickel is weaker than the adhesion between alumina and tungsten.

A release layer 3 is formed by sputtering tungsten in thickness of about 5 nm in a direction vertical to the recessed/projected substrate 4. With the sputtering in the vertical direction, a thin tungsten film is coated over the alumina surface while maintaining a recessed surface structure having the nanoholes. Then, a transfer thin-film layer 2 is formed by sputtering nickel in thickness of about 10 nm in a similar manner.

As shown in FIG. 4A, an epoxy resin adhesive 5 is coated on an aluminum transfer substrate 1 in thickness of about 100 nm by spin coating. The thus-coated aluminum transfer substrate 1 is positioned so as to face a surface of the transfer thin-film layer 2, pressed against it under a pressure of 2 MPa, and then separated therefrom after hardening the epoxy resin. Consequently, as shown in FIG. 4B, the transfer thin-film layer 2 of nickel is transferred to the epoxy resin adhesive 5 (step (3)). The aluminum transfer substrate 1 is subjected to dry etching using $BCl_3$ and $O_2$ gases with the transfer thin-film layer 2 of nickel serving as a mask. As a result, the transfer substrate 1 having a recessed/projected surface structure reflecting the mask pattern can be obtained (FIG. 4C).

Example 4

This Example 4 represents one example of the method of manufacturing the nano-structure according to the second aspect of the present invention.

A second method of the present invention comprises a step (1) of forming a recessed/projected surface structure in a substrate to prepare a recessed/projected substrate 4, a step (2) of forming a transfer thin-film layer 2 at least on projections 6 of the recessed/projected substrate 4, a step (3) of pressing a surface of the transfer thin-film layer 2 against a surface of a transfer substrate 1, peeling off the transfer thin-film layer 2 and transferring the transfer thin-film layer 2 formed at least on the projections 6 from the recessed/projected substrate 4 to the transfer substrate 1, a step (4) of forming a recessed/projected surface structure in a surface of the transfer substrate 1 by etching, and a step (5) of removing the transfer thin-film layer 2 from the surface of the transfer substrate 1.

After forming the nano-structure shown in FIG. 4C through the same steps as those in Example 3, the transfer substrate is washed using ultrasonic waves in an organic solvent, e.g., acetone, to remove the epoxy resin together with the transfer thin-film layer of nickel. Then, the nano-structure is immersed in a bath of oxalic acid at 16° C. and a voltage of 40 V is applied to the bath with the nano-structure serving as an anode, thereby forming nanoholes with the anodic oxidation process. As a result, a nano-structure having a higher aspect ratio can be manufactured. Further, with removal of the resin layer, it is possible to prevent an increase of impurity concentration in the acidic bath resulting from dissolution of the resin by an acid.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a structure, comprising the steps of:
   preparing a first substrate having a projection;
   forming a metal layer on the projection;
   transferring the metal layer with a projection pattern to a second substrate having a resin;
   etching a part of the second substrate to form a projection therein by using the metal layer as a mask;
   removing the metal layer and the resin from the second substrate; and
   anodizing the second substrate to form pores.

2. The method according to claim 1, wherein the second substrate has a second layer on a surface thereof.

3. The method according to claim 1, wherein a third layer is provided between the first substrate and the metal layer.

4. The method according to claim 1, further comprising a step of filling the pores with a functional material.

\* \* \* \* \*